United States Patent
Jo et al.

(10) Patent No.: US 11,456,191 B2
(45) Date of Patent: Sep. 27, 2022

(54) SUBSTRATE TREATING APPARATUS AND ROTATING ASSEMBLY

(71) Applicant: SEMES CO., LTD., Chungcheongnam-do (KR)

(72) Inventors: Kyeong Seok Jo, Chungcheongnam-do (KR); Yong Baek Kim, Chungcheongnam-do (KR); Han Bin Choi, Gyeongsangbuk-do (KR)

(73) Assignee: SEMES CO., LTD., Cheonan-si (KR)

( * ) Notice: Subject to any disclaimer, the term of this patent is extended or adjusted under 35 U.S.C. 154(b) by 285 days.

(21) Appl. No.: 16/931,124

(22) Filed: Jul. 16, 2020

(65) Prior Publication Data

US 2021/0020465 A1 Jan. 21, 2021

(30) Foreign Application Priority Data

Jul. 18, 2019 (KR) .......................... 10-2019-0087028

(51) Int. Cl.
*H01L 21/67* (2006.01)
*H01L 21/687* (2006.01)

(52) U.S. Cl.
CPC .. *H01L 21/67023* (2013.01); *H01L 21/68764* (2013.01)

(58) Field of Classification Search
CPC ......... H01L 21/67023; H01L 21/68764; H01L 21/68792; H01L 21/67028; H01L 21/67051; H01L 21/6708; H01L 21/6715
See application file for complete search history.

(56) References Cited

U.S. PATENT DOCUMENTS 8,282,771 B2 * 10/2012 Song ................. H01L 21/67034
156/345.55
8,382,555 B2 * 2/2013 Lee ......................... B24B 37/04
451/41

(Continued)

FOREIGN PATENT DOCUMENTS

JP 2008004766 A 1/2008
JP 2014099583 A 5/2014

(Continued)

OTHER PUBLICATIONS

Office Action in related Korean Patent Application No. 10-2019-0087028 dated Aug. 24, 2020 (5 pages).

*Primary Examiner* — Kaitlin S Joerger
(74) *Attorney, Agent, or Firm* — Procopio, Cory, Hargreaves & Savitch LLP

(57) ABSTRACT

An apparatus for treating a substrate includes a support unit including a support plate that supports the substrate and a rotary drive member that rotates the support plate and a lower fluid dispensing unit that dispenses a fluid onto a lower surface of the substrate supported on the support plate. The rotary drive member includes a hollow shaft coupled with the support plate and an actuator that rotates the hollow shaft. The lower fluid dispensing unit includes a fixed shaft that has an interior space and that is provided in the hollow shaft and a fluid dispensing tube that dispenses the fluid and that is provided in the interior space. An air-flow generation part is formed on an outer surface of the fixed shaft to generate a downward air flow in a space between the hollow shaft and the fixed shaft when the hollow shaft rotates.

20 Claims, 13 Drawing Sheets

(56) References Cited

U.S. PATENT DOCUMENTS

| | | | |
|---|---|---|---|
| 10,032,657 B2* | 7/2018 | Kim | H01L 21/6704 |
| 10,211,075 B2* | 2/2019 | Kim | B05D 3/002 |
| 2017/0153550 A1* | 6/2017 | Kim | H01L 21/6704 |
| 2018/0358241 A1* | 12/2018 | Lee | H01L 21/6708 |
| 2019/0006203 A1* | 1/2019 | Osawa | H01L 21/30604 |
| 2019/0043739 A1* | 2/2019 | Suzuki | H01L 21/67051 |
| 2019/0043740 A1* | 2/2019 | Miyahara | H01L 21/67034 |
| 2019/0262851 A1* | 8/2019 | Iwao | H01L 21/02057 |
| 2020/0027761 A1* | 1/2020 | Park | H01L 21/02041 |
| 2021/0020465 A1* | 1/2021 | Jo | H01L 21/68728 |

FOREIGN PATENT DOCUMENTS

| | | | | |
|---|---|---|---|---|
| KR | 10-2004-0045480 A | 6/2004 | | |
| KR | 1020110058560 A | 6/2011 | | |
| KR | 10-1558570 B | 10/2015 | | |
| KR | 102162188 B1 * | 10/2020 | ....... | H01L 21/67028 |

* cited by examiner

SUBSTRATE TREATING APPARATUS AND ROTATING ASSEMBLY

CROSS-REFERENCE TO RELATED APPLICATIONS

A claim for priority under 35 U.S.C. § 119 is made to Korean Patent Application No. 10-2019-0087028 filed on Jul. 18, 2019, in the Korean Intellectual Property Office, the entire contents of which are hereby incorporated by reference.

BACKGROUND

Embodiments of the inventive concept described herein relate to a substrate treating apparatus and a rotating assembly.

Various processes, such as photolithography, deposition, ashing, etching, ion implantation, and the like, are performed to manufacture semiconductor elements. Before and after these processes, a cleaning process is performed to clean particles remaining on a substrate.

The cleaning process is performed by dispensing a cleaning solution onto opposite surfaces of the substrate supported on a spin chuck. The lower surface of the substrate is cleaned by a treatment liquid supplied between the spin chuck supporting the substrate and the lower surface of the substrate by a lower fluid dispensing unit.

FIG. 1 is a view illustrating a general substrate treating apparatus. The general substrate treating apparatus 1000 may include a spin chuck 1100, a hollow shaft 1200, a hollow motor 1300, a fixed shaft 1400, and fluid dispensing tubes 1500.

Chuck pins 1110 and lift pins 1120 are provided on the spin chuck 1100. The chuck pins 1110 are movable in a lateral direction and support a side surface of a substrate W. The lift pins 1120 may raise or lower the substrate W in an up-down direction and may support a lower surface of the substrate W. The substrate W is supported on the spin chuck 1100 by the lift pins 1120 and the chuck pins 1110.

The spin chuck 1100 is coupled with the hollow shaft 1200. The hollow shaft 1200 has a space therein and is connected with the hollow motor 1300. The hollow motor 1300 rotates the hollow shaft 1200, and the hollow shaft 1200 rotates the spin chuck 1100.

The fixed shaft 1400 is provided in the interior space of the hollow shaft 1200. The fluid dispensing tubes 1500 are provided in the fixed shaft 1400. The fluid dispensing tubes 1500 dispense fluids to the lower surface of the substrate W. The fixed shaft 1400 is fixed even when the spin chuck 1100 is rotated.

A bearing 1130 is provided in a space between the fixed shaft 1400 and the spin chuck 1100. When the hollow motor 1300 rotates the spin chuck 1100, the bearing 1130 generates friction with the spin chuck 1100 and the fixed shaft 1400. Accordingly, the bearing 1130 is worn, and particles P are generated. The particles P may move upward and may adhere to the substrate W. The particles P may cause defects in a substrate treating process. Furthermore, if the particles P remain around the bearing 1130, the particles P may generate friction with the bearing 1130 when the spin chuck 1100 rotates. Therefore, the lifetime of the bearing 1130 is shortened.

SUMMARY

Embodiments of the inventive concept provide a substrate treating apparatus for efficiently treating a substrate.

Furthermore, embodiments of the inventive concept provide a substrate treating apparatus for minimizing adhesion of particles to a substrate in a process of treating the substrate.

Moreover, embodiments of the inventive concept provide a substrate treating apparatus for effectively discharging particles generated in a support unit.

In addition, embodiments of the inventive concept provide a rotating assembly for effectively discharging particles generated while a body is rotated.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for treating a substrate includes a support unit including a support plate that supports the substrate and a rotary drive member that rotates the support plate and a lower fluid dispensing unit that dispenses a fluid onto a lower surface of the substrate supported on the support plate. The rotary drive member includes a hollow shaft coupled with the support plate and an actuator that rotates the hollow shaft. The lower fluid dispensing unit includes a fixed shaft that has an interior space and that is provided in the hollow shaft and a fluid dispensing tube that dispenses the fluid and that is provided in the interior space. An air-flow generation part is formed on an outer surface of the fixed shaft to generate a downward air flow in a space between the hollow shaft and the fixed shaft when the hollow shaft rotates.

According to an embodiment, the air-flow generation part may have a helical shape.

According to an embodiment, the apparatus may further include a controller that controls the rotary drive member, and the controller may control the rotary drive member to rotate the hollow shaft in the same direction as a helical direction of the air-flow generation part.

According to an embodiment, the air-flow generation part may be formed as a protrusion on the outer surface of the fixed shaft.

According to an embodiment, the air-flow generation part may be formed as a groove on the outer surface of the fixed shaft.

According to an embodiment, the fluid dispensing tube may include a liquid dispensing tube that dispenses a treatment liquid and a gas dispensing tube that dispenses a drying gas, and the liquid dispensing tube and the gas dispensing tube may be provided in the interior space.

According to an embodiment, the hollow shaft and the fixed shaft may be located to be spaced apart from each other.

According to an embodiment, a bearing may be provided in a space between the support plate and the fixed shaft.

According to an exemplary embodiment, an apparatus for treating a substrate includes a support unit including a support plate that supports the substrate and a rotary drive member that rotates the support plate and a lower fluid dispensing unit that dispenses a fluid onto a lower surface of the substrate supported on the support plate. The rotary drive member includes a hollow shaft coupled with the support plate and an actuator that rotates the hollow shaft. The lower fluid dispensing unit includes a fixed shaft that has an interior space and that is provided in the hollow shaft and a fluid dispensing tube that dispenses the fluid and that is provided in the interior space. An air-flow generation part is formed on an inner surface of the hollow shaft to generate a downward air flow in a space between the hollow shaft and the fixed shaft when the hollow shaft rotates.

According to an embodiment, the air-flow generation part may have a helical shape.

According to an embodiment, the apparatus may further include a controller that controls the rotary drive member, and the controller may control the rotary drive member to rotate the hollow shaft in the same direction as a helical direction of the air-flow generation part.

According to an embodiment, the air-flow generation part may be formed as a protrusion on the inner surface of the hollow shaft.

According to an embodiment, the air-flow generation part may be formed as a groove on the inner surface of the hollow shaft.

According to an exemplary embodiment, a rotating assembly includes a body, a hollow shaft coupled to the body to rotate the body, and an insert provided in the hollow shaft and located to be spaced apart from the hollow shaft, the insert being fixed in position when the hollow shaft rotates. An air-flow generation part is formed on an outer surface of the insert to generate a downward air flow in a space between the hollow shaft and the insert when the hollow shaft rotates.

According to an embodiment, the air-flow generation part may have a helical shape.

According to an embodiment, the air-flow generation part may be formed as a protrusion on the outer surface of the insert.

According to an embodiment, the air-flow generation part may be formed as a groove on the outer surface of the insert.

According to an exemplary embodiment, a rotating assembly includes a body, a hollow shaft coupled to the body to rotate the body, and an insert provided in the hollow shaft and located to be spaced apart from the hollow shaft, the insert being fixed in position when the hollow shaft rotates. An air-flow generation part may be formed on an inner surface of the hollow shaft to generate a downward air flow in a space between the hollow shaft and the insert when the hollow shaft rotates.

According to an embodiment, the air-flow generation part may have a helical shape.

According to an embodiment, the air-flow generation part may be formed as a protrusion on the inner surface of the hollow shaft.

According to an embodiment, the air-flow generation part may be formed as a groove on the inner surface of the hollow shaft.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
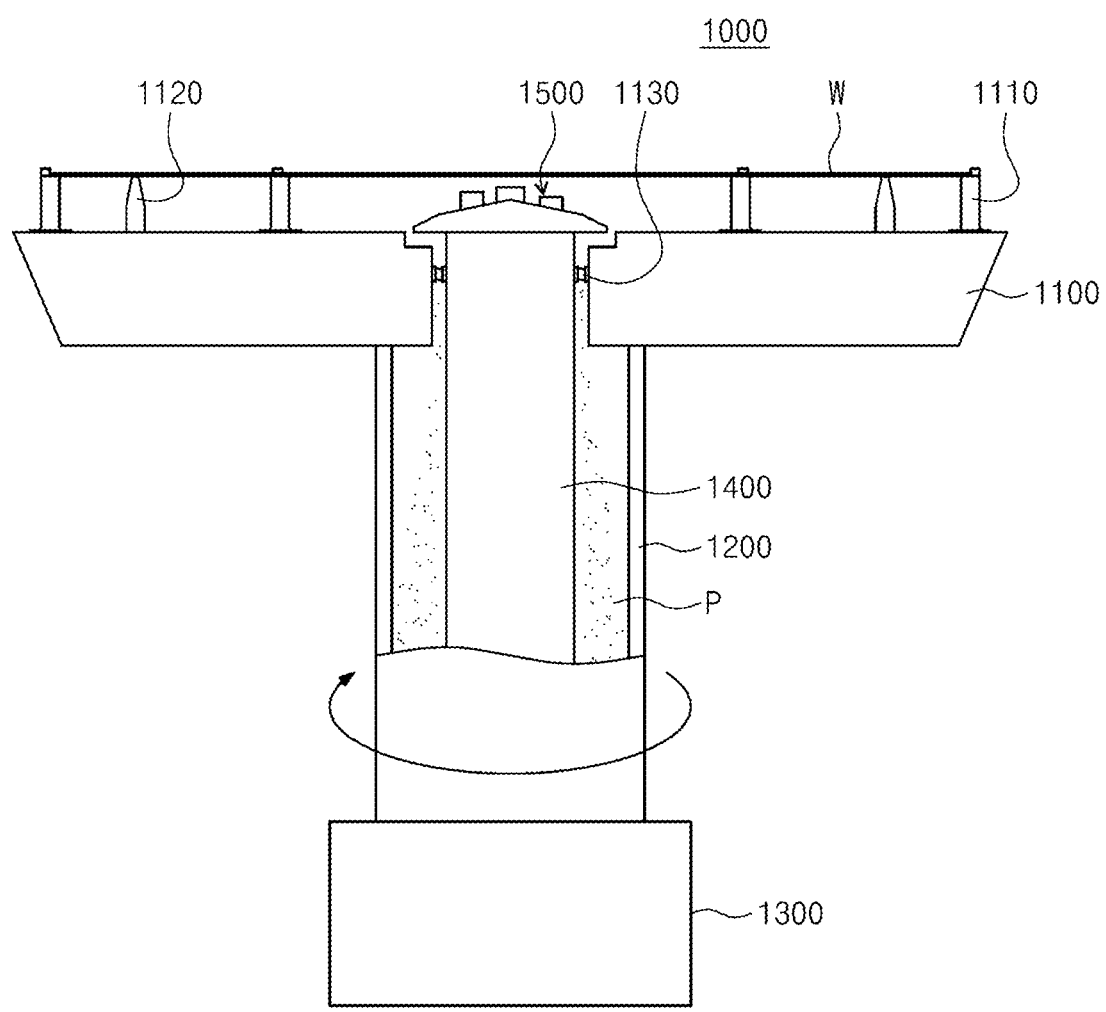
FIG. 1 is a view illustrating a general substrate treating apparatus.

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms of a singular form may include plural forms unless otherwise specified. Furthermore, in the drawings, the shapes and dimensions of components may be exaggerated for clarity of illustration.

Hereinafter, embodiments of the inventive concept will be described in detail with reference to FIGS. 2 to 13.

Figure 2:
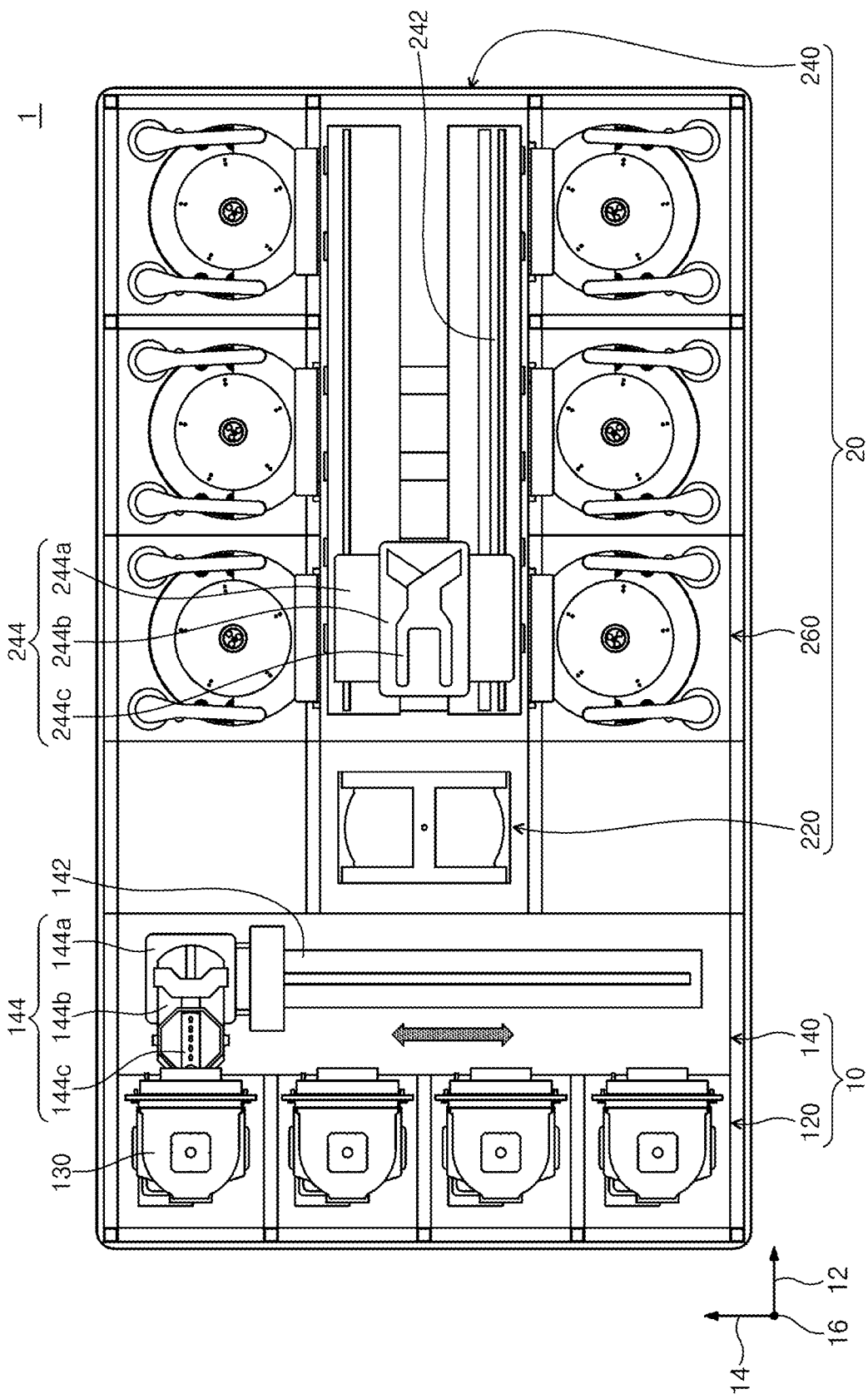
FIG. 2 is a plan view illustrating substrate treating equipment according to an embodiment of the inventive concept.

FIG. 2 is a plan view illustrating substrate treating equipment according to an embodiment of the inventive concept. Referring to FIG. 2, the substrate treating equipment 1 has an index module 10 and a process module 20. The index module 10 has a load port 120 and a transfer frame 140. The load port 120, the transfer frame 140, and the process module 20 are sequentially arranged in a row. Hereinafter, a direction in which the load port 120, the transfer frame 140, and the process module 20 are arranged is referred to as a first direction 12, a direction perpendicular to the first direction 12 when viewed from above is referred to as a second direction 14, and a direction perpendicular to the plane including the first direction 12 and the second direction 14 is referred to as a third direction 16.

A carrier 130 having substrates W received therein is seated on the load port 120. A plurality of load ports 120 are provided. The load ports 120 are disposed in a row along the second direction 14. The number of load ports 120 may be increased or decreased depending on process efficiency and footprint of the process module 20. The carrier 130 has a plurality of slots (not illustrated) formed therein in which the substrates W are received in horizontal positions relative to the ground. A front opening unified pod (FOUP) may be used as the carrier 130.

The process module 20 has a buffer unit 220, a transfer chamber 240, and process chambers 260. The transfer chamber 240 is disposed such that the lengthwise direction thereof is parallel to the first direction 12. The process chambers 260 are disposed on opposite sides of the transfer chamber 240. On the opposite sides of the transfer chamber 240, the process chambers 260 are provided to be symmetric to each other with respect to the transfer chamber 240. A plurality of process chambers 260 are provided on one side of the transfer chamber 240. Some of the process chambers 260 are disposed along the lengthwise direction of the transfer chamber 240. Furthermore, other process chambers 260 are stacked one above another. That is, the process chambers 260 may be disposed in an A×B array on the one side of the transfer chamber 240. Here, "A" denotes the number of process chambers 260 provided in a row along the first direction 12, and "B" denotes the number of process chambers 260 provided in a column along the third direction 16. In a case where four or six process chambers 260 are provided on the one side of the transfer chamber 240, the process chambers 260 may be disposed in a 2×2 or 3×2 array. The number of process chambers 260 may be increased or decreased. Alternatively, the process chambers 260 may be provided on only the one side of the transfer chamber 240. In another case, the process chambers 260 may be provided in a single layer on the opposite sides of the transfer chamber 240.

The buffer unit 220 is disposed between the transfer frame 140 and the transfer chamber 240. The buffer unit 220 provides a space in which the substrates W stay before transferred between the transfer chamber 240 and the transfer frame 140. The buffer unit 220 has slots (not illustrated) formed therein in which the substrates W are placed. The slots (not illustrated) are spaced apart from each other along the third direction 16. The buffer unit 220 is open at one side facing the transfer frame 140 and at an opposite side facing the transfer chamber 240.

The transfer frame 140 transfers the substrates W between the carriers 130 seated on the load ports 120 and the buffer unit 220. An index rail 142 and an index robot 144 are provided in the transfer frame 140. The index rail 142 is disposed such that the lengthwise direction thereof is parallel to the second direction 14. The index robot 144 is installed on the index rail 142 and rectilinearly moves along the index rail 142 in the second direction 14. The index robot 144 has a base 144a, a body 144b, and an index arm 144c. The base 144a is installed so as to be movable along the index rail 142. The body 144b is coupled to the base 144a. The body 144b is movable on the base 144a along the third direction 16. Furthermore, the body 144b is rotatable on the base 144a. The index arm 144c is coupled to the body 144b and is movable forward and backward relative to the body 144b. A plurality of index arms 144c are provided. The index arms 144c are individually driven. The index arms 144c are stacked one above another with a spacing gap therebetween along the third direction 16. Some of the index arms 144c may be used to transfer the substrates W from the process module 20 to the carriers 130, and the other index arms 144c may be used to transfer the substrates W from the carriers 130 to the process module 20. Accordingly, particles generated from the substrates W that are to be treated may be prevented from adhering to the treated substrates W in a process in which the index robot 144 transfers the substrates W between the carriers 130 and the process module 200.

The transfer chamber 240 transfers the substrates W between the buffer unit 220 and the process chambers 260 and between the process chambers 260. A guide rail 242 and a main robot 244 are provided in the transfer chamber 240. The guide rail 242 is disposed such that the lengthwise direction thereof is parallel to the first direction 12. The main robot 244 is installed on the guide rail 242 and rectilinearly moves on the guide rail 242 along the first direction 12.

The main robot 244 has a base 244a, a body 244b, and a main arm 244c. The base 244a is installed so as to be movable along the guide rail 242. The body 244b is coupled to the base 244a. The body 244b is movable on the base 244a along the third direction 16. Furthermore, the body 244b is rotatable on the base 244a. The main arm 244c is coupled to the body 244b and is movable forward and backward relative to the body 244b. A plurality of main arms 244c are provided. The main arms 244c are individually driven. The main arms 244c are stacked one above another with a spacing gap therebetween along the third direction 16.

The process chambers 260 are equipped with substrate treating apparatuses 300 for performing liquid treatment processes on the substrates W. The substrate treating apparatuses 300 may have different structures depending on the types of cleaning processes performed.

Alternatively, the substrate treating apparatuses 300 in the respective process chambers 260 may have the same structure. Selectively, the process chambers 260 may be divided into a plurality of groups. The substrate treating apparatuses 300 in the process chambers 260 belonging to the same group may have the same structure, and the substrate treating apparatuses 300 in the process chambers 260 belonging to different groups may have different structures.

The substrate treating apparatuses 300 perform liquid treatment processes on the substrates W. In this embodiment, the liquid treatment processes for the substrates W will be exemplified by a cleaning process. Without being limited to the cleaning process, however, the liquid treatment processes may include various processes such as a photolithography process, an ashing process, an etching process, and the like.

Figure 3:
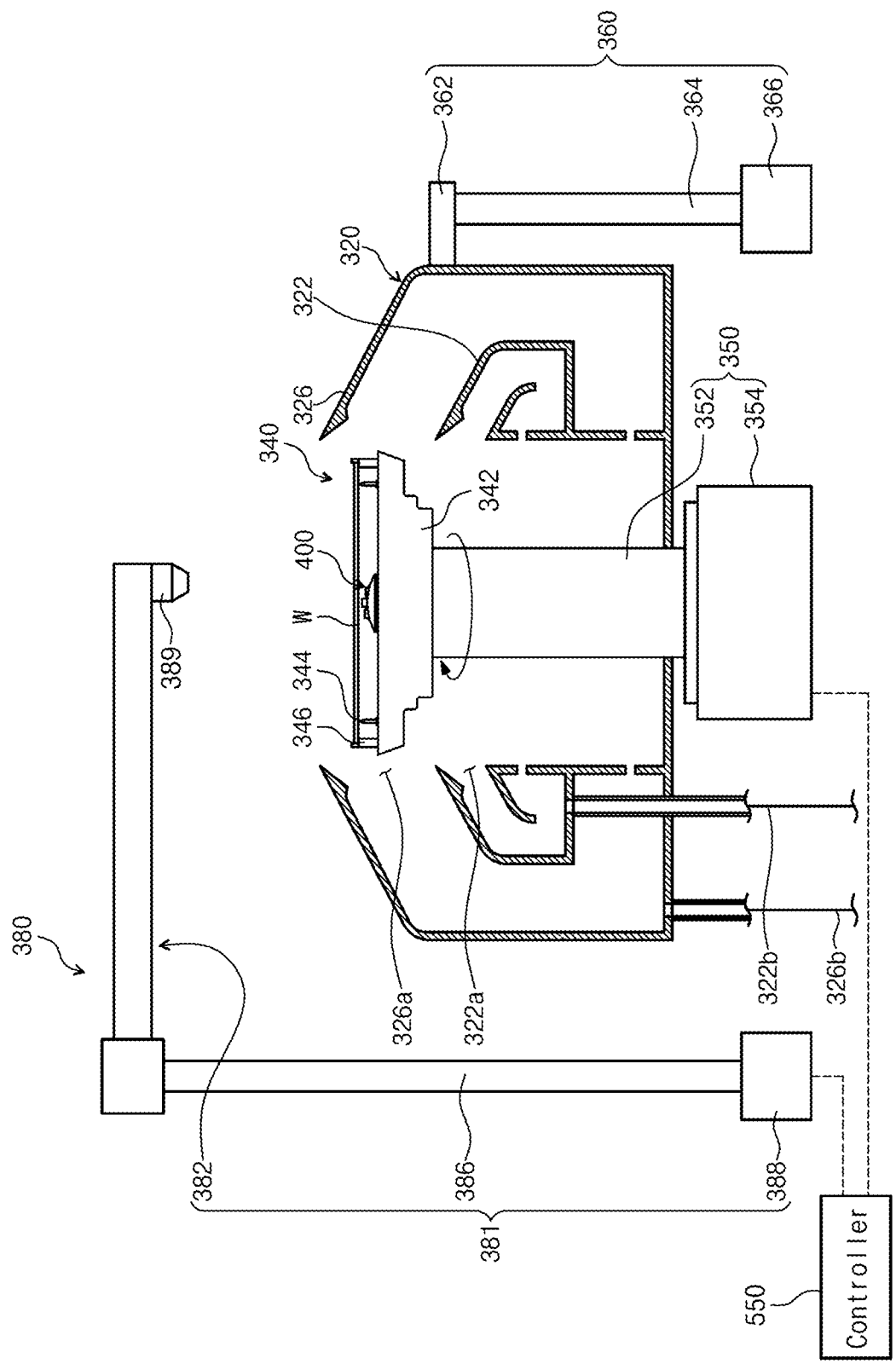
FIG. 3 is a sectional view illustrating a substrate treating apparatus of FIG. 2.

FIG. 3 is a sectional view illustrating the substrate treating apparatus of FIG. 2. Referring to FIG. 3, the substrate treating apparatus 300 includes a treatment vessel 320, a support unit 340, a lifting unit 360, an upper fluid dispensing unit 380, a lower fluid dispensing unit 400, a bearing 500, and a controller 550.

The treatment vessel 320 provides a treatment space in which a substrate W is treated. The treatment vessel 320 has a cylindrical shape that is open at the top. The treatment vessel 320 has an inner recovery bowl 322 and an outer recovery bowl 326. The recovery bowls 322 and 326 recover different treatment liquids used for processes. The inner recovery bowl 322 has an annular ring shape that surrounds the support unit 340, and the outer recovery bowl 326 has an annular ring shape that surrounds the inner recovery bowl 322. An inner space 322a of the inner recovery bowl 322 and the inner recovery bowl 322 function as the first inlet 322a through which a treatment liquid is introduced into the inner recovery bowl 322. A space 326a between the inner recovery bowl 322 and the outer recovery bowl 326 functions as the second inlet 326a through which a treatment liquid is introduced into the outer recovery bowl 326. According to an embodiment, the inlets 322a and 326a may be located at different heights. Recovery lines 322b and 326b are connected to the bottoms of the recovery bowls 322 and 326, respectively. The treatment liquids introduced into the recovery bowls 322 and 326 may be delivered to an external treatment liquid regeneration system (not illustrated) through the recovery lines 322b and 326b and may be regenerated by the regeneration system.

The support unit 340 supports the substrate W in the treatment space. The support unit 340 supports and rotates the substrate W during the processes. The support unit 340 has a support plate 342, a support pin 344, a chuck pin 346, and a rotary drive member 350. The support plate 342 is provided in a substantially circular plate shape and has an upper surface and a lower surface. The lower surface has a smaller diameter than the upper surface. The upper surface and the lower surface are located such that the central axes thereof are in agreement with each other. The support pin 344 and the chuck pin 346 may be provided on the support plate 342. The support pin 344 and the chuck pin 346 may support a lateral portion and a lower surface of the substrate W, respectively. Accordingly, the support plate 342 may support the substrate W.

A plurality of support pins 344 are provided. The support pins 344 are disposed on an edge portion of the upper surface of the support plate 342 so as to be spaced apart from each other at predetermined intervals. The support pins 344 protrude upward from the support plate 342. The support pins 344 are disposed to form an annular ring shape as a whole by a combination thereof. The support pins 344 support the edge of the lower surface of the substrate W such that the substrate W is spaced apart from the upper surface of the support plate 342 by a predetermined distance.

A plurality of chuck pins 346 are provided. The chuck pins 346 are disposed farther away from the center of the support plate 342 than the support pins 344. The chuck pins 346 protrude upward from the upper surface of the support plate 342. The chuck pins 346 support the lateral portion of the substrate W such that the substrate W does not deviate from a correct position to a side when the support plate 342 is rotated. The chuck pins 346 are rectilinearly movable between an outer position and an inner position along the radial direction of the support plate 342. The outer position is a position farther away from the center of the support plate 342 than the inner position. When the substrate W is loaded onto or unloaded from the support plate 342, the chuck pins 346 are located in the outer position, and when a process is performed on the substrate W, the chuck pins 346 are located in the inner position. The inner position is a position in which the chuck pins 346 and the lateral portion of the substrate W are brought into contact with each other, and the outer position is a position in which the chuck pins 346 and the substrate W are spaced apart from each other.

The rotary drive member 350 rotates the support plate 342. The support plate 342 is rotatable about the central axis thereof by the rotary drive member 350. The rotary drive member 350 includes a hollow shaft 352 and an actuator 354. The hollow shaft 352 has a cylindrical shape facing in the third direction 16. An upper end of the hollow shaft 352 is fixedly coupled to the lower surface of the support plate 342. The actuator 354 provides a driving force to rotate the hollow shaft 352. The actuator 354 may be a motor. The actuator 354 may be a hollow motor having a central portion that is open at the top and the bottom. The hollow shaft 352 is rotated by the actuator 354, and the support plate 342 is rotatable together with the hollow shaft 352.

The lifting unit 360 rectilinearly moves the treatment vessel 320 in an up-down direction.

The height of the treatment vessel 320 relative to the support plate 342 is changed as the treatment vessel 320 is moved in the up-down direction. When the substrate W is loaded onto or unloaded from the support plate 342, the lifting unit 360 lowers the treatment vessel 320 such that the support plate 342 further protrudes upward beyond the treatment vessel 320. Furthermore, when the processes are performed, the height of the treatment vessel 320 is adjusted depending on the types of treatment liquids dispensed onto the substrate W, such that the treatment liquids are introduced into the preset recovery bowls 322 and 326. The lifting unit 360 has a bracket 362, a movable shaft 364, and an actuator 366. The bracket 362 is fixedly attached to an outer wall of the treatment vessel 320, and the movable shaft 364 is fixedly coupled to the bracket 362 and is moved in the up-down direction by the actuator 366. Selectively, the lifting unit 360 may move the support plate 342 in the up-down direction.

The upper fluid dispensing unit 380 dispenses a treatment liquid onto an upper surface of the substrate W. The upper surface of the substrate W may be a patterned surface on which a pattern is formed. A plurality of upper fluid dispensing units 380 may be provided. The upper fluid dispensing units 380 may dispense different types of treatment liquids onto the substrate W. Each of the upper fluid dispensing units 380 includes a moving member 381 and a nozzle 389.

The moving member 381 moves the nozzle 389 between a process position and a standby position. Here, the process position is defined as a position in which the nozzle 389 is opposite the substrate W supported on the support unit 340, and the standby position is defined as a position in which the nozzle 389 deviates from the process position. According to an embodiment, the process position includes a pre-treatment position and a post-treatment position. The pre-treatment position is a position in which the nozzle 389 dispenses a treatment liquid to a first dispensing position, and the post-treatment position is a position in which the nozzle 389 dispenses the treatment liquid to a second dispensing position. The first dispensing position may be a position closer to the center of the substrate W than the second dispensing position, and the second dispensing position may be a position including an end portion of the substrate W. Selectively, the second dispensing position may be an area adjacent to the end portion of the substrate W.

The moving member 381 includes a support shaft 386, an arm 382, and a drive member 388. The support shaft 386 is located on one side of the treatment vessel 320. The support shaft 386 has a rod shape, the lengthwise direction of which is parallel to the third direction 16. The support shaft 386 is rotatable by the drive member 388. The support shaft 386 is movable upward and downward. The arm 382 is coupled to an upper end of the support shaft 386. The arm 382 extends from the support shaft 386 at a right angle thereto. The nozzle 382 is fixedly coupled to an end of the arm 382. As the support shaft 386 is rotated, the nozzle 389 is able to swing together with the arm 382. The nozzle 389 may swing between the process position and the standby position. Selectively, the arm 382 is movable forward and backward along the lengthwise direction thereof. When viewed from above, the path along which the nozzle 389 is moved may be in agreement with the central axis of the substrate W in the process position. For example, the treatment liquids may include a chemical, a rinsing solution, and an organic solvent. The chemical may be a liquid having a property of acid or base. The chemical may include sulfuric acid ($H_2SO_4$), phosphoric acid ($P_2O_5$), hydrofluoric acid (HF), and ammonium hydroxide ($NH_4OH$). The rinsing solution may be deionized water ($H_2O$). The organic solvent may be isopropyl alcohol (IPA).

The lower fluid dispensing unit 400 may clean and dry the lower surface of the substrate W. The lower fluid dispensing unit 400 may dispense a fluid to the lower surface of the substrate W. The lower surface of the substrate W may be an unpatterned surface that is opposite to the surface on which the pattern is formed. The lower fluid dispensing unit 400 may dispense a liquid at the same time as the upper fluid dispensing unit 380. The lower fluid dispensing unit 400 may be fixed so as not to be rotated.

Figure 4:
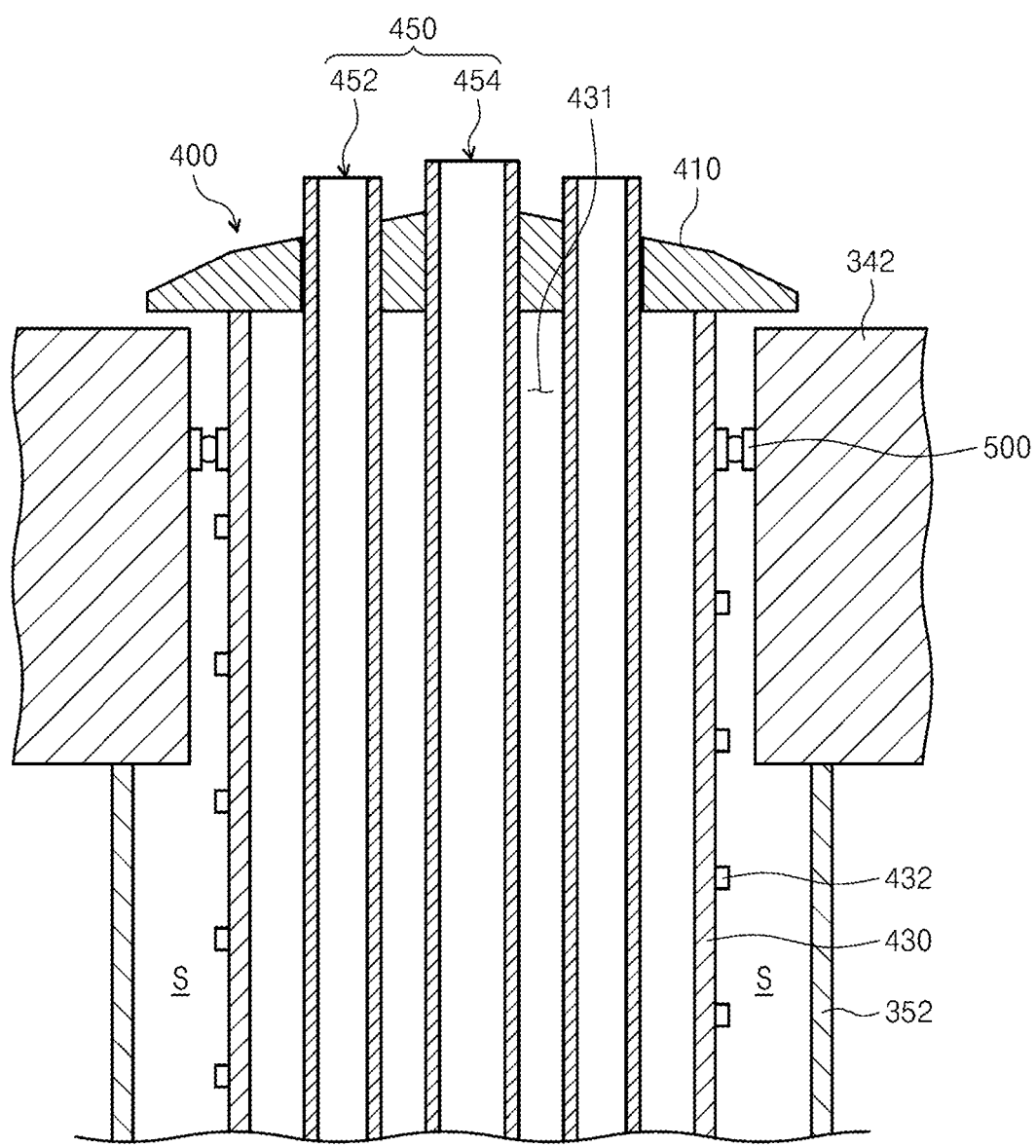
FIG. 4 is a sectional view illustrating a support unit, a lower fluid dispensing unit, and part of a rotary drive member of the inventive concept.
Figure 5:
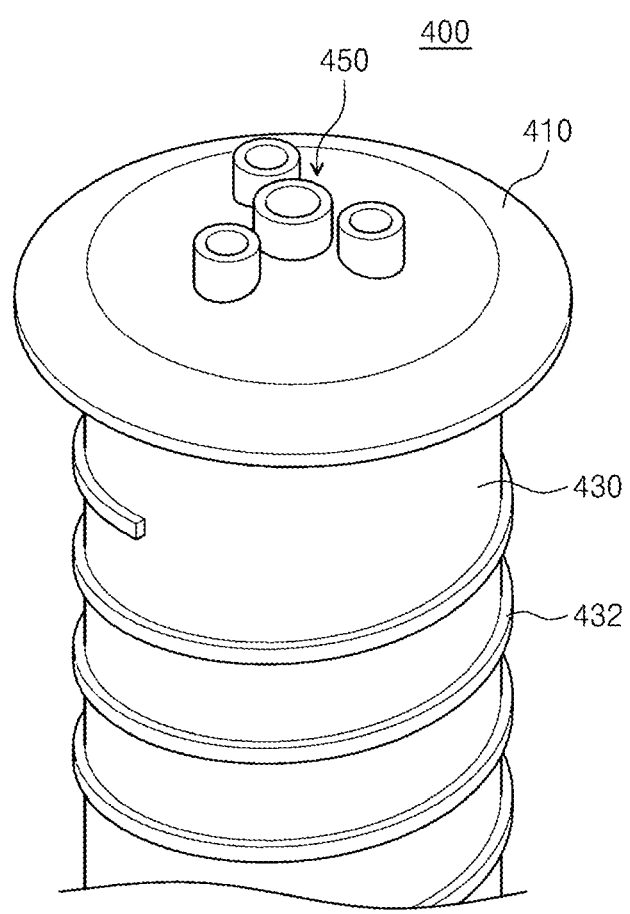
FIG. 5 is a view illustrating the lower fluid dispensing unit of FIG. 4.

FIG. 4 is a sectional view illustrating the support unit, the lower fluid dispensing unit, and part of the rotary drive member of the inventive concept, and FIG. 5 is a view illustrating the lower fluid dispensing unit of FIG. 4. Referring to FIGS. 4 and 5, the lower fluid dispensing unit 400 may include a cover 410, a fixed shaft 430, and fluid dispensing tubes 450.

The cover 410 may be provided at an upper end of the fixed shaft 430. The cover 410 may have a plurality of holes formed therein. The fluid dispensing tubes 450, which will be described below, may be inserted into the plurality of holes formed in the cover 410. The cover 410 may prevent the positions of the fluid dispensing tubes 450 from being changed. The cover 410 may be provided so as to be detachable from the fixed shaft 430.

The fixed shaft 430 may have an interior space 431. The fixed shaft 430 may be provided in the hollow shaft 352. The fixed shaft 430 may be located to be spaced apart from the hollow shaft 352. The fixed shaft 430 may be located to be spaced apart from an inner surface of the hollow shaft 352 by a predetermined distance. Furthermore, the fixed shaft 430 may be inserted into a hole formed in the support plate 342. The fixed shaft 430 may be inserted into a hole formed in a central area of the support plate 342 when viewed from above. The fluid dispensing tubes 450 may be provided in the interior space 431 of the fixed shaft 430.

An air-flow generation part 432 may be formed on an outer surface of the fixed shaft 430.

The air-flow generation part 432 may generate a downward air flow when the hollow shaft 352 and the support plate 342 rotate. The air-flow generation part 432 may generate a downward air flow in a space S between the hollow shaft 352 and the fixed shaft 430 when the hollow shaft 352 and the support plate 342 rotate. The air-flow generation part 432 may generate a downward air flow in a space S between the support plate 342 and the fixed shaft 430. The air-flow generation part 432 may be formed on the outer surface of the fixed shaft 430 along the lengthwise direction of the fixed shaft 430. The air-flow generation part 432 may have a helical shape. The air-flow generation part 432 may protrude in a direction from the central axis of the fixed shaft 430 to the outer surface of the air-flow generation part 432. The air-flow generation part 432 may be formed as a protrusion on the outer surface of the fixed shaft 430.

The fluid dispensing tubes 450 may dispense fluids to the lower surface of the substrate W. The fluid dispensing tubes 450 may dispense the fluids to the lower surface of the substrate W supported on the support plate 342. The fluid dispensing tubes 450 may include a liquid dispensing tube 452 and a gas dispensing tube 454. The liquid dispensing tube 4521 and the gas dispensing tube 454 may be provided in the interior space 431 of the fixed shaft 430.

The liquid dispensing tube 452 dispenses a treatment liquid to the lower surface of the substrate W. The treatment liquid dispensed from the liquid dispensing tube 452 cleans the lower surface of the substrate W. The liquid dispensing tube 452 has a liquid dispensing end that faces upward. For example, the liquid dispensing end may face upward in the vertical direction. A plurality of liquid dispensing tubes 452 may be provided. The liquid dispensing tubes 452 may dispense different types of liquids. The liquid dispensing tubes 452 may be fixed to the cover 410. The liquid dispensing tubes 452 are located to be spaced apart from the center of the cover 410. The liquid dispensing tubes 452 are arranged to surround the center of the cover 410. The treatment liquids dispensed from the liquid dispensing tubes 452 may include a chemical and a rinsing solution. The chemical may be a liquid having a property of acid or base. The chemical may include sulfuric acid ($H_2SO_4$), phosphoric acid ($P_2O_5$), hydrofluoric acid (HF), and ammonium hydroxide ($NH_4OH$). The rinsing solution may be deionized water ($H_2O$). Selectively, the liquid dispensing end may be upwardly inclined so as to be farther away from the center of the substrate W with an approach to the top of the liquid dispensing end.

The gas dispensing tube 454 dispenses a drying gas. The gas dispensing tube 454 may be fixed to the cover 410. The gas dispensing tube 454 is located on the central axis of the cover 410. The gas dispensing tube 454 includes an upper dispensing end. The upper dispensing end may face upward in the vertical direction. The gas dispensed from the gas dispensing tube 454 is supplied to the lower surface of the substrate W. The gas dispensed from the gas dispensing tube 454 dries the lower surface of the substrate W. For example, the drying gas may be an inert gas or air. The inert gas may be nitrogen gas ($N_2$).

The bearing 500 may be provided in the space S between the support plate 342 and the fixed shaft 430. The bearing 500 may prevent friction between the fixed shaft 430 and the support plate 342 when the support plate 342 rotates. Furthermore, the bearing 500 may be coupled to the fixed shaft 430. Moreover, the bearing 500 may be located above the air-flow generation part 432 formed on the fixed shaft 430.

The controller 550 may control the substrate treating equipment 1. The controller 550 may control the substrate treating apparatus 300. The controller 550 may control the rotary drive member 350. The controller 550 may control the actuator 354. The controller 550 may control the rotational direction of the support unit 340 by controlling the actuator 354. The controller 550 may control the rotary drive member 350 to rotate the hollow shaft 352 in the same direction as the helical direction of the air-flow generation part 432.

Figure 6:
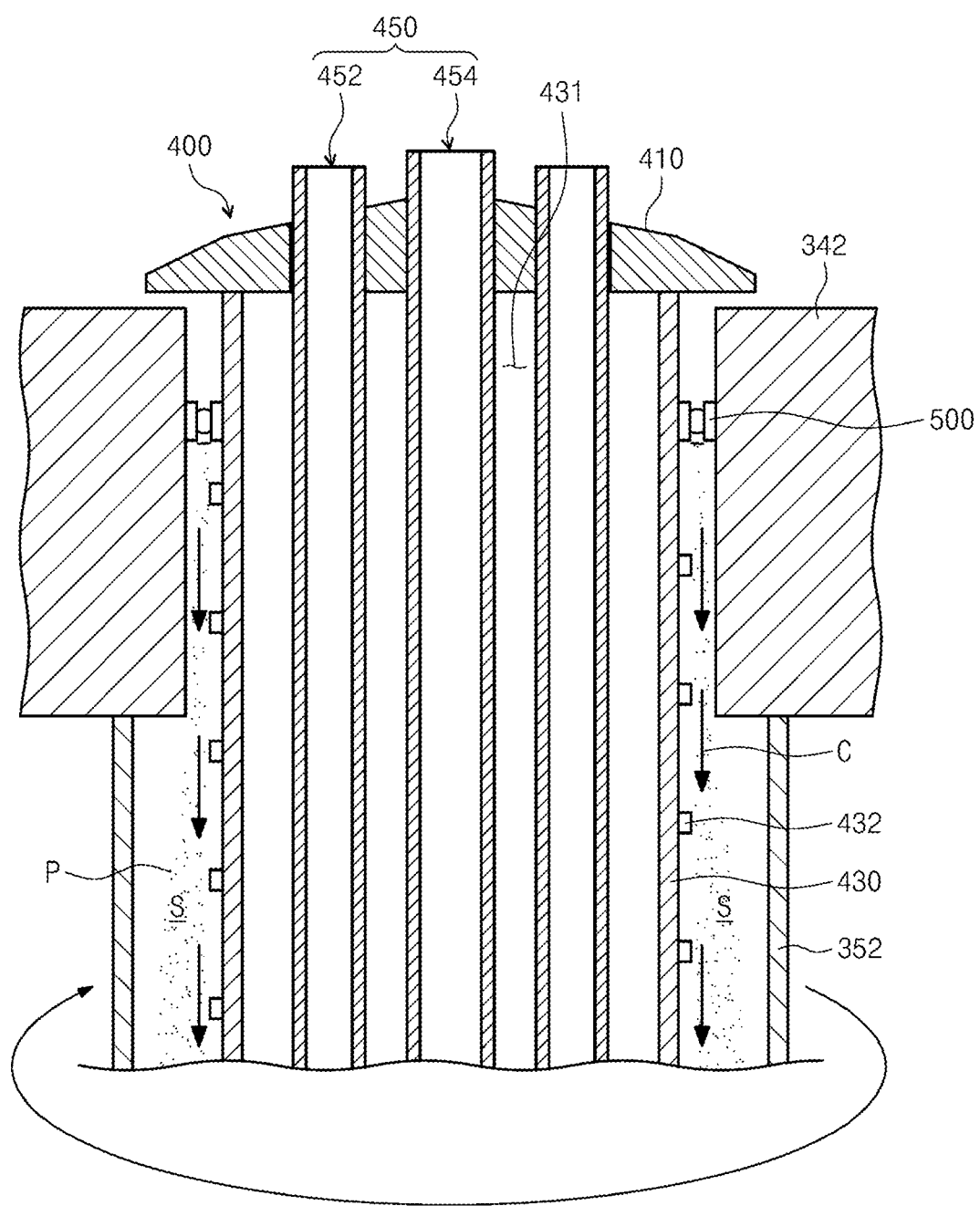
FIG. 6 is a view illustrating a state in which the support unit is rotated by the rotary drive member.

FIG. 6 is a view illustrating a state in which the support unit is rotated by the rotary drive member. Referring to FIG. 6, the support plate 342 is coupled with the hollow shaft 352. Accordingly, as the hollow shaft 352 rotates, the support plate 342 also rotates. At this time, the fixed shaft 430 is fixed without rotating. When the support plate 342 and the hollow shaft 352 rotate, the bearing 500 provided in the space S between the support plate 342 and the fixed shaft 430 is worn. Accordingly, the bearing 500 generates impurities such as particles P. According to an embodiment of the inventive concept, when the support plate 342 and the hollow shaft 352 rotate, a downward air flow C may be generated in the space S between the support plate 342 and the fixed shaft 430 and in the space S between the hollow shaft 352 and the fixed shaft 430. Specifically, the air-flow generation part 432 formed as the protrusion on the outer surface of the fixed shaft 430 may be provided in a helical shape. When the support plate 342 and the hollow shaft 352 rotate, an air flow is generated in the intervening space S. The air flow generated in the intervening space S flows downward along the air-flow generation part 432 having the helical shape. That is, when the support plate 342 and the hollow shaft 352 rotate, the downward air flow C is generated in the intervening space S. The downward air flow C generated in the intervening space S flows downward together with the particles P generated by the bearing 500.

In a general substrate treating apparatus, when a spin chuck rotates, a bearing provided between the spin chuck and a fixed shaft is worn, and therefore particles are generated. The generated particles may move toward a substrate W and may cause defects in a substrate treating process. Furthermore, when the particles remain in a space between the fixed shaft and the spin chuck, the particles additionally generate friction with the bearing, and therefore the lifetime of the bearing is shortened. However, according to an embodiment of the inventive concept, when the support plate 342 and the hollow shaft 352 rotate, the downward air flow C is generated in the space S between the fixed shaft 430 and the support plate 342 and in the space S between the fixed shaft 430 and the hollow shaft 352. Thus, the particles P generated in the intervening space S may be effectively discharged, and defects caused by the particles P in a substrate treating process or a decrease in the lifetime of the bearing 500 may be minimized.

Figure 7:
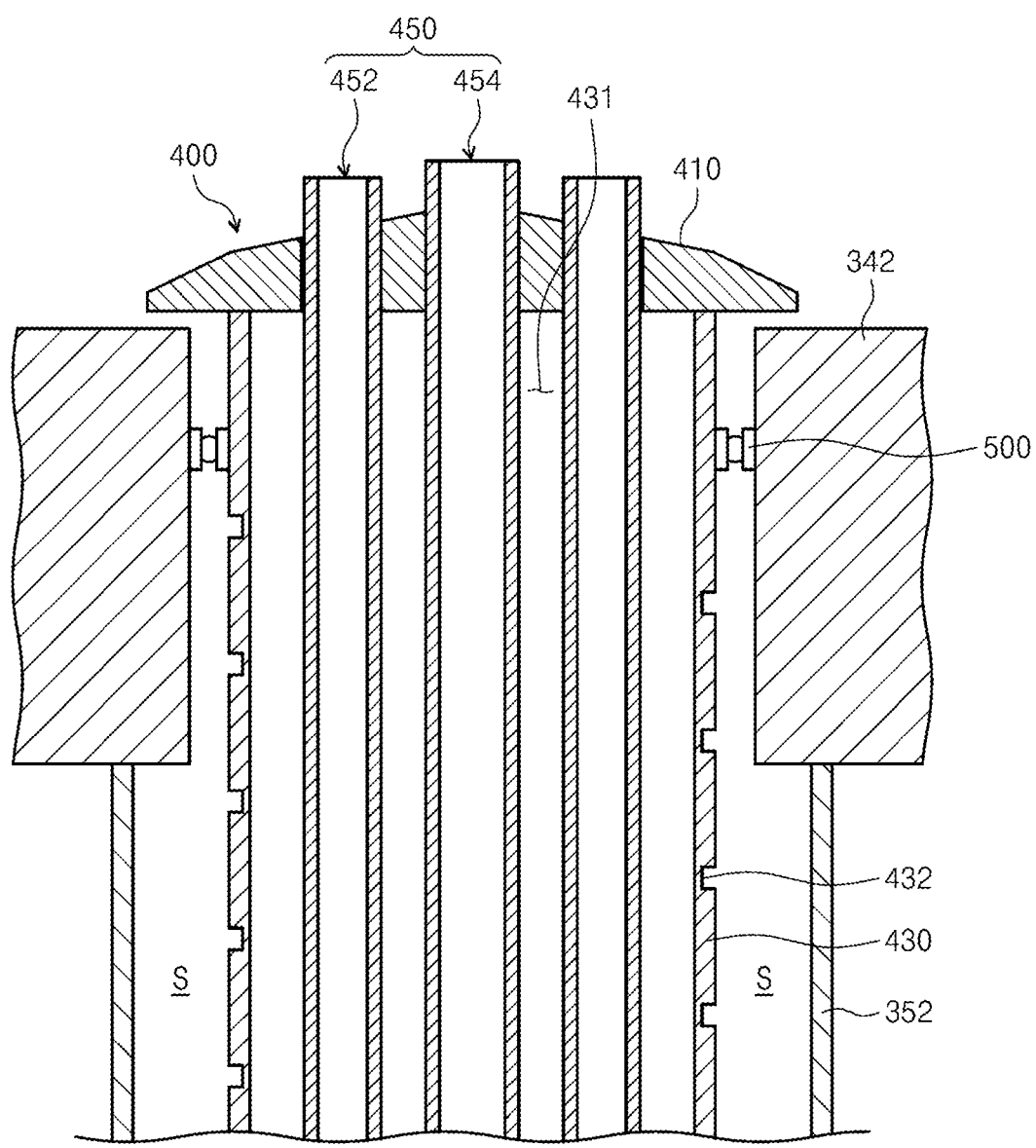
FIG. 7 is a view illustrating a lower fluid dispensing unit according to another embodiment of the inventive concept.

Although it has been exemplified that the air-flow generation part 432 is formed as the protrusion on the outer surface of the fixed shaft 430, the air-flow generation part 432 is not limited thereto. For example, as illustrated in FIG. 7, the air-flow generation part 432 may be formed as a groove on the outer surface of the fixed shaft 430. The air-flow generation part 432 formed as the groove may be concavely formed in a direction from the outer surface of the fixed shaft 430 to the center of the fixed shaft 430.

Figure 8:
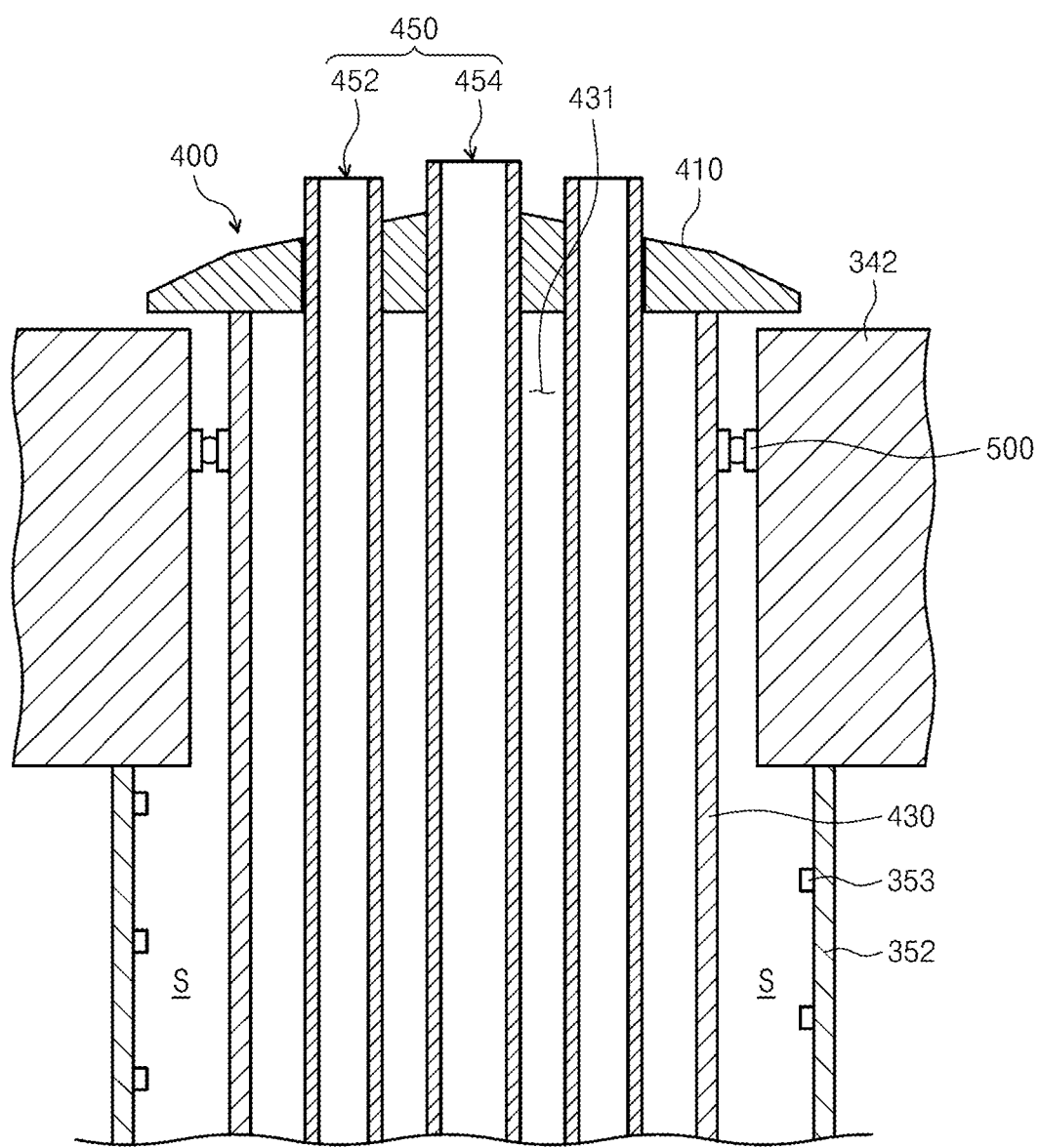
FIG. 8 is a view illustrating a rotary drive member according to another embodiment of the inventive concept.
Figure 9:
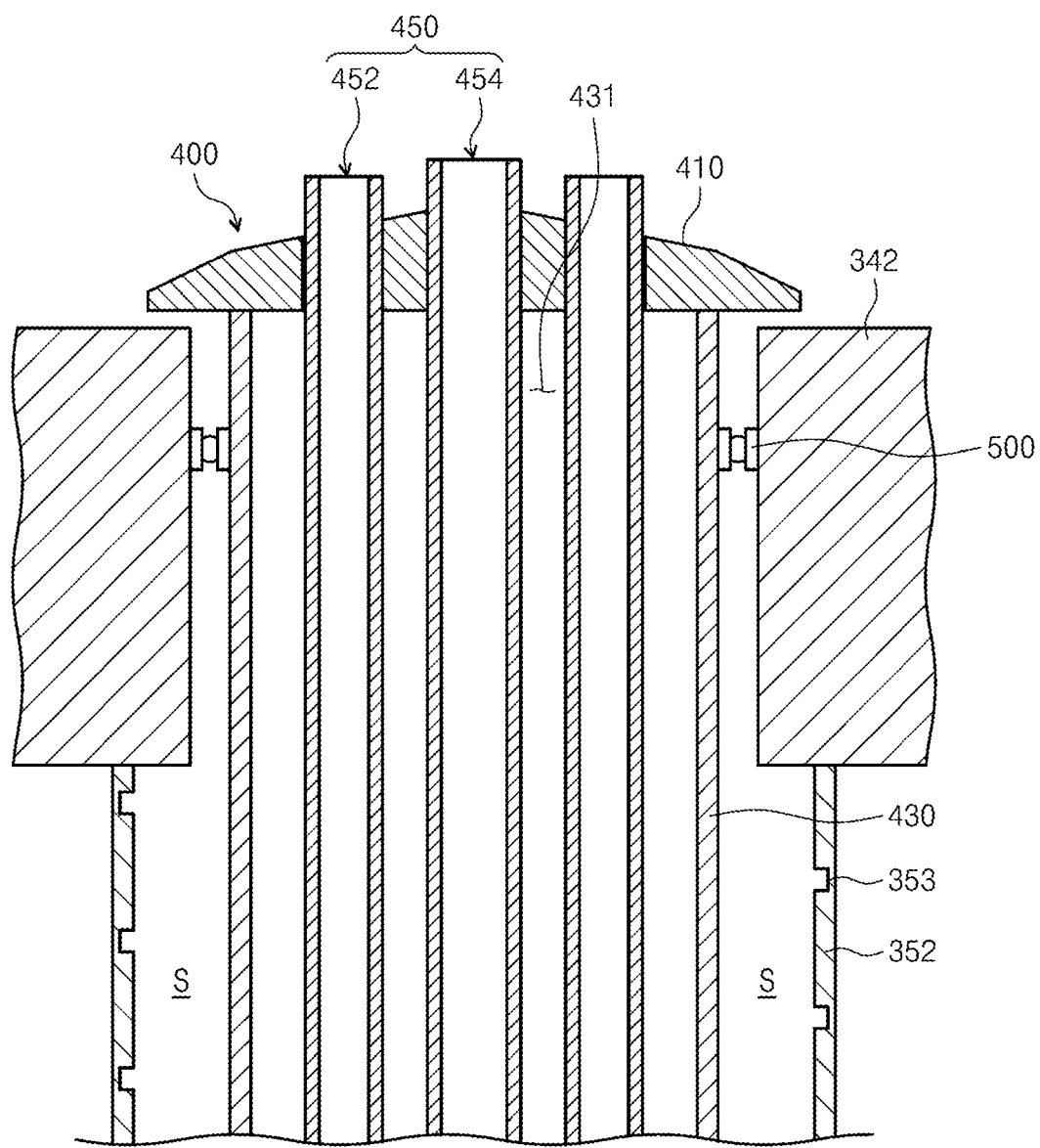
FIG. 9 is a view illustrating a rotary drive member according to another embodiment of the inventive concept.

In the above-described embodiments, it has been exemplified that the air-flow generation part 432 is formed on the outer surface of the fixed shaft 430. However, the inventive concept is not limited thereto. For example, as illustrated in FIG. 8, an air-flow generation part 353 may be formed on the inner surface of the hollow shaft 352 to generate a downward air flow in the space S between the hollow shaft 352 and the fixed shaft 430 when the hollow shaft 352 rotates. In this case, the air-flow generation part 353 may be formed along the lengthwise direction of the hollow shaft 352. The air-flow generation part 353 may have a helical shape. The air-flow generation part 353 may be formed as a protrusion on the inner surface of the hollow shaft 352. Alternatively, as illustrated in FIG. 9, the air-flow generation part 353 may be formed as a groove on the inner surface of the hollow shaft 352. Functions and effects derived by the configuration of the rotary drive member 350 illustrated in FIGS. 8 and 9 are the same as, or similar to, those described above. Therefore, detailed description thereabout will be omitted.

Figure 10:
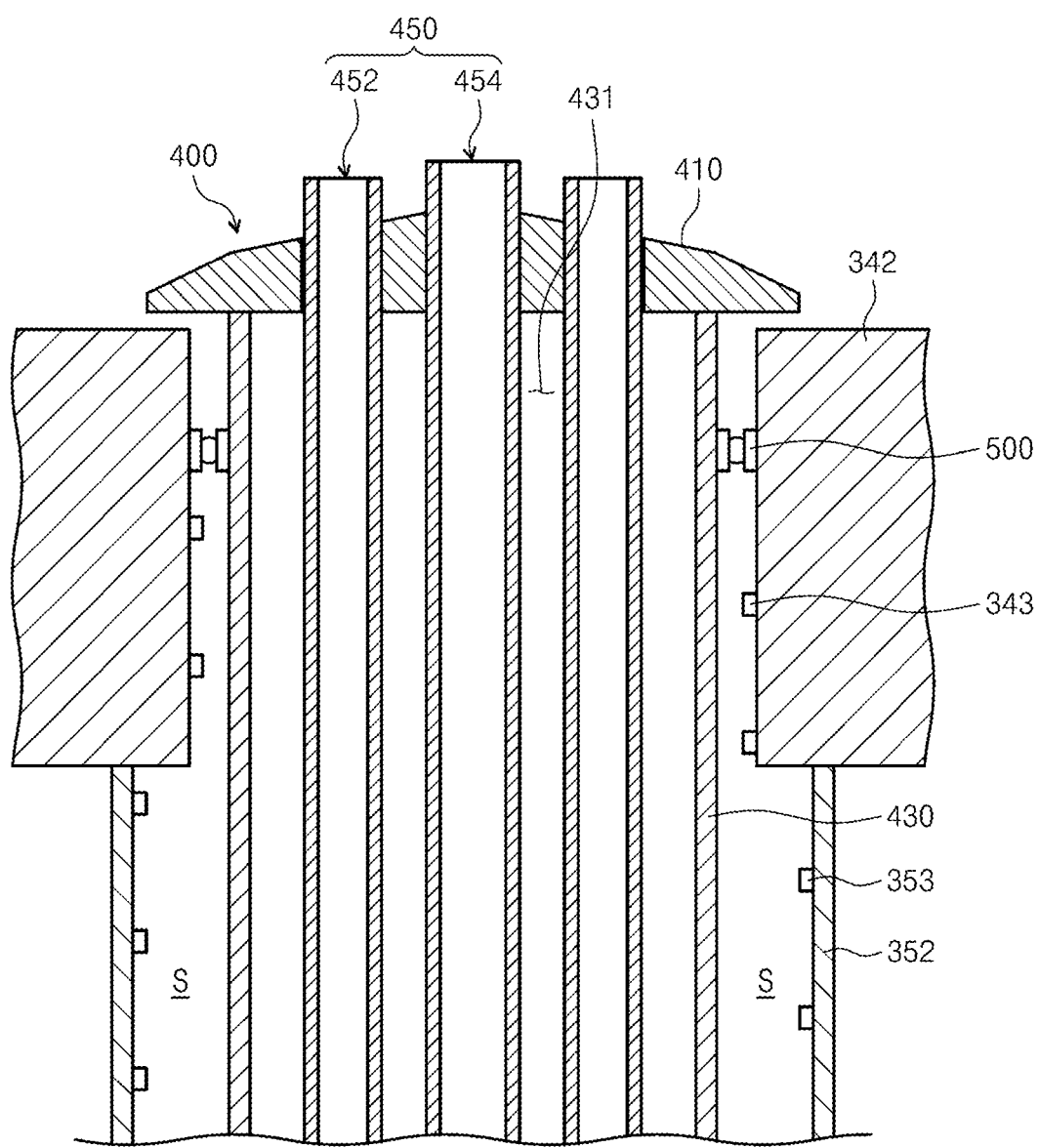
FIG. 10 is a view illustrating a support unit according to another embodiment of the inventive concept.
Figure 11:
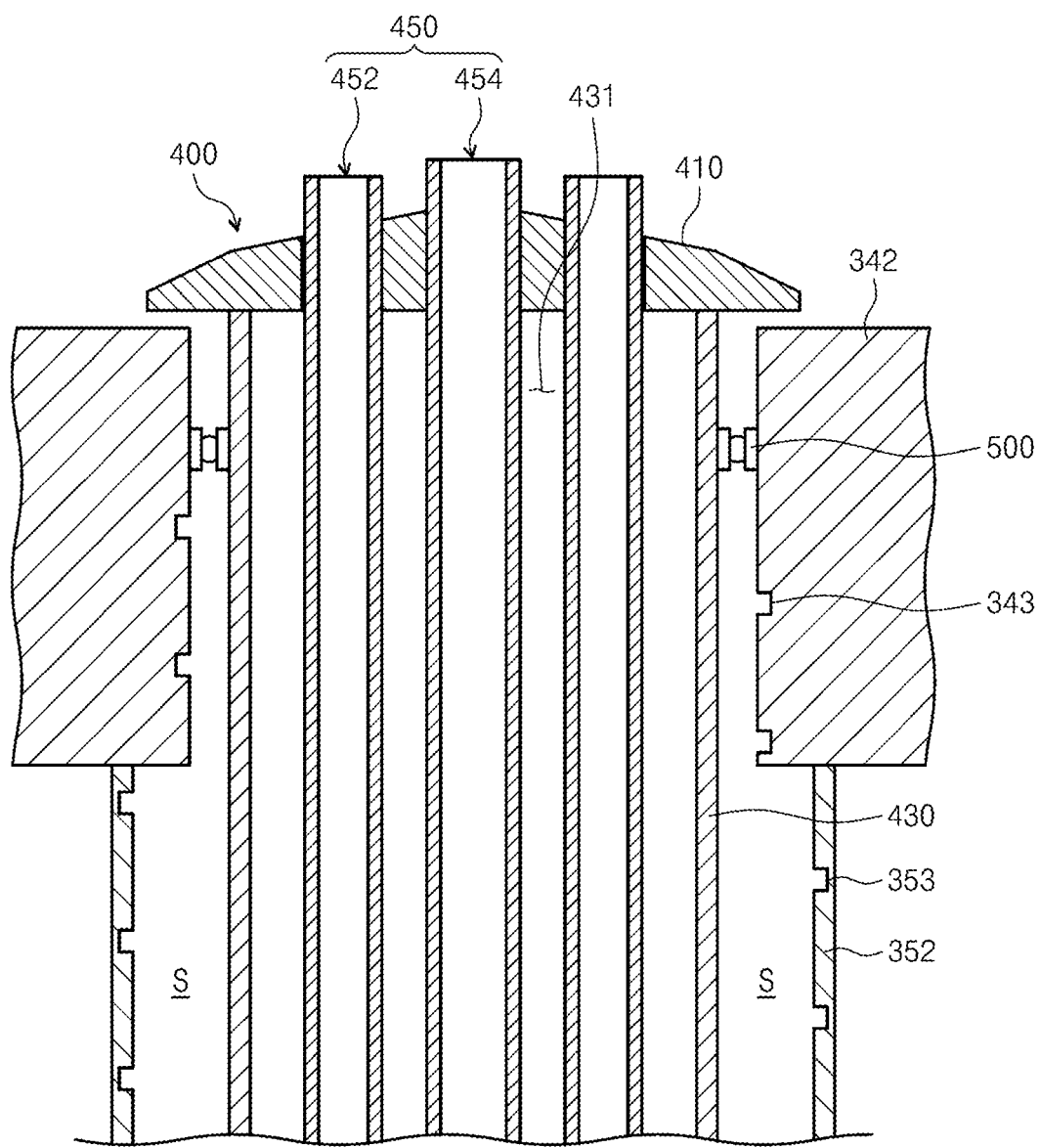
FIG. 11 is a view illustrating a support unit according to another embodiment of the inventive concept.

In the above-described embodiments, it has been exemplified that the air-flow generation parts 432 and 353 are formed on the fixed shaft 430 and/or the hollow shaft 352. However, the inventive concept is not limited thereto. For example, as illustrated in FIGS. 10 and 11, an air-flow generation part 343 may be formed on the support plate 342. Likewise to the air-flow generation parts 432 and 353, the air-flow generation part 343 formed on the support plate 342 may be formed as a groove or a protrusion.

In the above-described embodiments, it has been exemplified that the air-flow generation parts 432 and 353 are formed on the fixed shaft 430 and/or the hollow shaft 352. However, the inventive concept is not limited thereto. An air-flow generation part may be formed on an inner surface of the actuator 354 implemented with a hollow motor.

Figure 12:
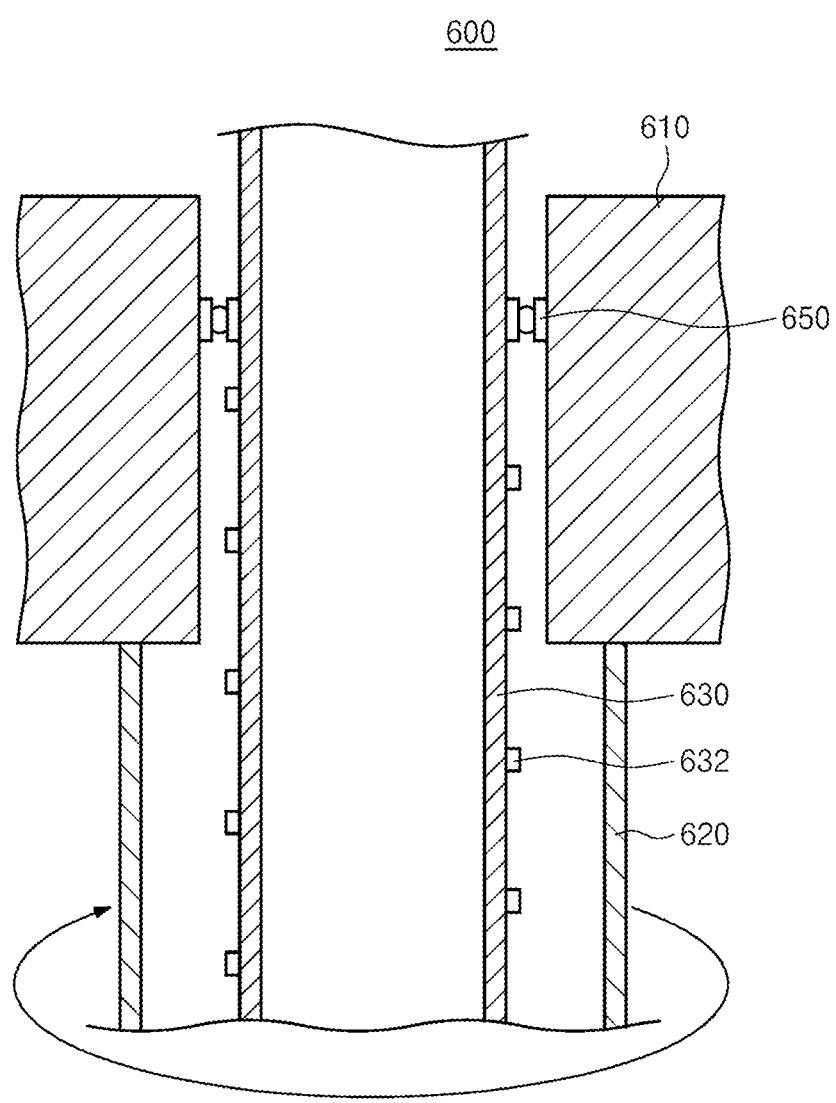
FIG. 12 is a view illustrating a rotating assembly according to an embodiment of the inventive concept.

In the above-described embodiments, it has been exemplified that the fixed shaft 430, the hollow shaft 352, and the support plate 342 are provided in the substrate treating apparatus 300 and the air-flow generation parts 432, 353, and 343 are formed on the fixed shaft 430, the hollow shaft 352, and the support plate 342. However, the inventive concept is not limited thereto. The above-described technical idea may be identically applied to various rotating assemblies that rotate bodies as well as an apparatus that treats a substrate. For example, as illustrated in FIG. 12, a rotating assembly 600 may include a body 610, a hollow shaft 620, an insert 630, and a bearing 650. The body 610 may have a hole formed therein. The insert 630 may be inserted into the hole formed in the body 610. The hollow shaft 620 may be coupled to the body 610. The hollow shaft 620 may be rotated by an actuator (not illustrated). Accordingly, the body 610 coupled with the hollow shaft 620 may be rotated. The bearing 650 may be provided in a space between the body 610 and the insert 630.

The insert 630 may be provided in the hollow shaft 620. The insert 630 may be located to be spaced apart from the hollow shaft 620. When the hollow shaft 620 rotates, the insert 630 may be fixed in position. An air-flow generation part 632 may be formed on an outer surface of the insert 630 to generate a downward air flow in a space between the hollow shaft 620 and the insert 630. The air-flow generation part 632 may be formed along the lengthwise direction of the insert 630. The air-flow generation part 632 may have a helical shape. The air-flow generation part 632 may be formed as a protrusion on the outer surface of the insert 630. Without being limited thereto, however, the air-flow generation part 632 may be formed as a groove on the outer surface of the insert 630. Accordingly, an air flow generated when the hollow shaft 620 rotates may flow downward along the air-flow generation part 632 having the helical shape. Thus, particles generated while the bearing 650 is worn may be discharged to the outside together with the downward air flow.

Figure 13:
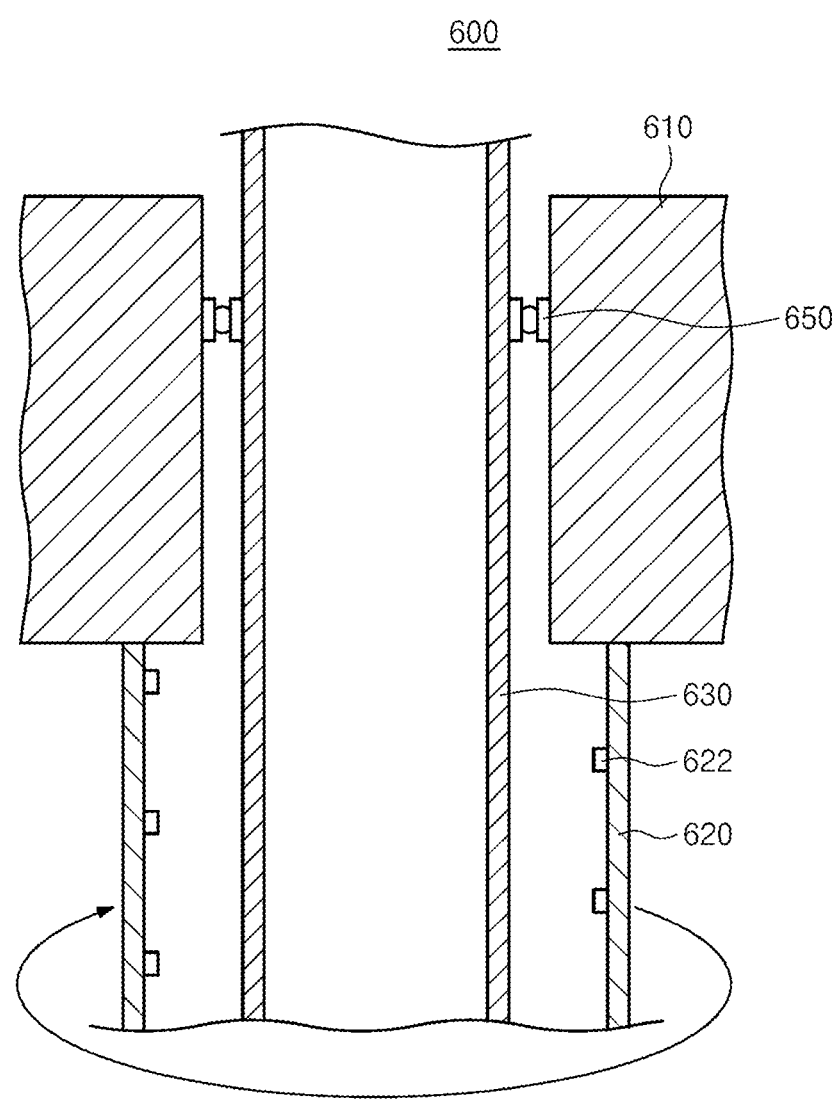
FIG. 13 is a view illustrating a rotating assembly according to another embodiment of the inventive concept.

In the above-described embodiment, it has been exemplified that the air-flow generation part 632 is formed on the outer surface of the insert 630. However, the inventive concept is not limited thereto. For example, as illustrated in FIG. 13, an air-flow generation part 622 may be formed on an inner surface of the hollow shaft 620. The air-flow generation part 622 may be formed as a protrusion on the inner surface of the hollow shaft 620. Without being limited thereto, however, the air-flow generation part 622 may be formed as a groove on the inner surface of the hollow shaft 620. Functions and effects derived by the air-flow generation part 622 formed on the inner surface of the hollow shaft 620 are the same as, or similar to, those described above. Therefore, detailed description thereabout will be omitted.

As described above, according to the embodiments of the inventive concept, the inventive concept may efficiently treat a substrate.

Furthermore, according to the embodiments of the inventive concept, adhesion of particles to a substrate may be minimized in a process of treating the substrate.

Moreover, according to the embodiments of the inventive concept, particles generated in a support unit may be effectively discharged.

In addition, according to the embodiments of the inventive concept, particles generated while a body is rotated may be effectively discharged.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
a support unit including a support plate configured to support the substrate and a rotary drive member configured to rotate the support plate; and
a lower fluid dispensing unit configured to dispense a fluid onto a lower surface of the substrate supported on the support plate,
wherein the rotary drive member includes:
a hollow shaft coupled with the support plate; and
an actuator configured to rotate the hollow shaft,
wherein the lower fluid dispensing unit includes:
a fixed shaft having an interior space and provided in the hollow shaft; and
a fluid dispensing tube configured to dispense the fluid and provided in the interior space, and
wherein an air-flow generation part is formed on an outer surface of the fixed shaft to generate a downward air flow in a space between the hollow shaft and the fixed shaft when the hollow shaft rotates.

2. The apparatus of claim 1, wherein the air-flow generation part has a helical shape.

3. The apparatus of claim 2, wherein the apparatus further comprises a controller configured to control the rotary drive member, and
wherein the controller controls the rotary drive member to rotate the hollow shaft in the same direction as a helical direction of the air-flow generation part.

4. The apparatus of claim 1, wherein the air-flow generation part is formed as a protrusion on the outer surface of the fixed shaft.

5. The apparatus of claim 1, wherein the air-flow generation part is formed as a groove on the outer surface of the fixed shaft.

6. The apparatus of claim 1, wherein the fluid dispensing tube includes:
a liquid dispensing tube configured to dispense a treatment liquid; and
a gas dispensing tube configured to dispense a drying gas, and
wherein the liquid dispensing tube and the gas dispensing tube are provided in the interior space.

7. The apparatus of claim 1, wherein the hollow shaft and the fixed shaft are located to be spaced apart from each other.

8. The apparatus of claim 1, wherein a bearing is provided in a space between the support plate and the fixed shaft.

9. An apparatus for treating a substrate, the apparatus comprising:
a support unit including a support plate configured to support the substrate and a rotary drive member configured to rotate the support plate; and
a lower fluid dispensing unit configured to dispense a fluid onto a lower surface of the substrate supported on the support plate,
wherein the rotary drive member includes:
a hollow shaft coupled with the support plate; and
an actuator configured to rotate the hollow shaft,
wherein the lower fluid dispensing unit includes:
a fixed shaft having an interior space and provided in the hollow shaft; and
a fluid dispensing tube configured to dispense the fluid and provided in the interior space, and
wherein an air-flow generation part is formed on an inner surface of the hollow shaft to generate a downward air flow in a space between the hollow shaft and the fixed shaft when the hollow shaft rotates.

10. The apparatus of claim 9, wherein the air-flow generation part has a helical shape.

11. The apparatus of claim 9, wherein the apparatus further comprises a controller configured to control the rotary drive member, and
wherein the controller controls the rotary drive member to rotate the hollow shaft in the same direction as a helical direction of the air-flow generation part.

12. The apparatus of claim 9, wherein the air-flow generation part is formed as a protrusion on the inner surface of the hollow shaft.

13. The apparatus of claim 9, wherein the air-flow generation part is formed as a groove on the inner surface of the hollow shaft.

14. A rotating assembly comprising:
a body;
a hollow shaft coupled to the body to rotate the body; and
an insert provided in the hollow shaft and located to be spaced apart from the hollow shaft, the insert being fixed in position when the hollow shaft rotates,
wherein an air-flow generation part is formed on an outer surface of the insert to generate a downward air flow in a space between the hollow shaft and the insert when the hollow shaft rotates.

15. The rotating assembly of claim 14, wherein the air-flow generation part has a helical shape.

16. The rotating assembly of claim 15, wherein the air-flow generation part is formed as a protrusion on the outer surface of the insert.

17. The rotating assembly of claim 15, wherein the air-flow generation part is formed as a groove on the outer surface of the insert.

18. A rotating assembly comprising:
a body;
a hollow shaft coupled to the body to rotate the body; and
an insert provided in the hollow shaft and located to be spaced apart from the hollow shaft, the insert being fixed in position when the hollow shaft rotates,
wherein an air-flow generation part is formed on an inner surface of the hollow shaft to generate a downward air flow in a space between the hollow shaft and the insert when the hollow shaft rotates, and wherein the air-flow generation part has a helical shape.

19. The rotating assembly of claim 18, wherein the air-flow generation part is formed as a protrusion on the inner surface of the hollow shaft.

20. The rotating assembly of claim 18, wherein the air-flow generation part is formed as a groove on the inner surface of the hollow shaft.

\* \* \* \* \*